(12) United States Patent
Song

(10) Patent No.: US 12,074,267 B2
(45) Date of Patent: Aug. 27, 2024

(54) DISPLAY APPARATUS USING SEMICONDUCTOR LIGHT-EMITTING DEVICE

(71) Applicant: LG ELECTRONICS INC., Seoul (KR)

(72) Inventor: Hooyoung Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 515 days.

(21) Appl. No.: 17/291,145

(22) PCT Filed: Nov. 5, 2019

(86) PCT No.: PCT/KR2019/014878
§ 371 (c)(1),
(2) Date: May 4, 2021

(87) PCT Pub. No.: WO2020/096314
PCT Pub. Date: May 14, 2020

(65) Prior Publication Data
US 2021/0376211 A1    Dec. 2, 2021

(30) Foreign Application Priority Data
Nov. 9, 2018 (KR) .......... 10-2018-0137659

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC ..... H01L 33/62; H01L 25/0753; H01L 24/16; H01L 33/0095; H01L 2224/1403;
(Continued)

(56) References Cited

U.S. PATENT DOCUMENTS 7,696,522 B2 * 4/2010 Ono .................... H01L 25/0753
257/E33.001
8,860,075 B2 * 10/2014 Izuka ..................... H01L 33/62
257/781
(Continued)

FOREIGN PATENT DOCUMENTS

CN    101350381 A  * 1/2009  ............. H01L 24/06
JP    2006093406 A * 4/2006  ............. H01L 24/17
(Continued)

*Primary Examiner* — Jonathan Han
(74) *Attorney, Agent, or Firm* — Birch, Stewart, Kolasch & Birch, LLP

(57) ABSTRACT

Discussed is a display apparatus, including at least one horizontal semiconductor light emitting device having a first conductive electrode and a second conductive electrode; first and second wirings spaced apart from each other on a substrate, and electrically connected to the first and second conductive electrodes, respectively; a first bump disposed between the first wiring and the first conductive electrode; and a second bump disposed between the second wiring and the second conductive electrode, wherein at least one of the first and second bumps protrudes toward the other one from an edge of either one of the first and second wirings.

14 Claims, 13 Drawing Sheets

(58) Field of Classification Search
CPC ......... H01L 21/34; H01L 21/64; H01L 21/67;
H01L 21/561; H01L 21/568; H01L
2224/11; H01L 2224/1134; H01L
2224/13019; H01L 2224/13082; H01L
2224/16225; H01L 2224/81001; H01L
2224/95; H01L 2924/1306; H01L
2924/12041; H01L 2924/18161; H01L
27/156; H01L 24/14; H01L 24/81; H01L
33/36
USPC ............ 257/82, E21.508, E21.511, E23.021,
257/E33.001
See application file for complete search history.

(56) References Cited

U.S. PATENT DOCUMENTS

| | | | | |
|---|---|---|---|---|
| 9,178,115 | B2* | 11/2015 | Suzuki | H01L 25/0753 |
| 10,468,393 | B2* | 11/2019 | Yoo | H01L 33/0093 |
| 10,644,195 | B2* | 5/2020 | Tian | H01L 33/30 |
| 2009/0096095 | A1* | 4/2009 | Ishido | H01L 25/105 |
| | | | | 257/E21.511 |
| 2010/0044743 | A1 | 2/2010 | Liu et al. | |
| 2013/0049054 | A1 | 2/2013 | Namiki et al. | |
| 2013/0248916 | A1 | 9/2013 | Suehiro et al. | |
| 2015/0380620 | A1 | 12/2015 | Chae et al. | |
| 2017/0012026 | A1* | 1/2017 | Choi | H01L 23/5386 |
| 2019/0206587 | A1 | 7/2019 | Sou et al. | |
| 2021/0159441 | A1* | 5/2021 | Kwon | G06F 1/1616 |

FOREIGN PATENT DOCUMENTS

| | | | | |
|---|---|---|---|---|
| JP | 2009-99765 A | | 5/2009 | |
| JP | 2009099765 A | * | 5/2009 | ............ H01L 24/81 |
| KR | 10-2015-0014135 A | | 2/2015 | |
| KR | 10-2015-0078296 A | | 7/2015 | |
| KR | 10-2018-0082003 A | | 7/2018 | |
| TW | 201225209 A | * | 6/2012 | ........... H01L 21/563 |
| WO | WO 2018/047690 A1 | | 3/2018 | |

* cited by examiner

DISPLAY APPARATUS USING SEMICONDUCTOR LIGHT-EMITTING DEVICE

CROSS REFERENCE TO RELATED APPLICATIONS

This application is the National Stage filing under 35 U.S.C. 371 of International Application No. PCT/KR2019/014878, filed on Nov. 5, 2019, which claims the benefit of earlier filing date and right of priority to Korean Application No. 10-2018-0137659, filed on Nov. 9, 2018, the entire contents of all these applications are hereby expressly incorporated by reference into the present application.

BACKGROUND

1. Technical Field

The present disclosure relates to a display apparatus, and more particularly, to a display apparatus using a semiconductor light emitting device.

2. Description of the Related Art

In recent years, display apparatuses having excellent characteristics such as low profile, flexibility and the like have been developed in the display technical field. On the contrary, currently commercialized main displays are represented by liquid crystal displays (LCDs) and active-matrix organic light-emitting diodes (AMOLEDs).

However, there exist problems such as not-so-fast response time, low profile, difficult implementation of flexibility in case of LCDs, and there exist drawbacks such as short life span, not-so-good yield as well as low profile, low flexibility in case of AMOLEDs.

On the other hand, light-emitting diodes (LEDs) are well known light-emitting devices for converting an electrical current to light, and have been used as a light source for displaying an image in an electronic device including information communication devices since red LEDs using GaAsP compound semiconductors were made commercially available in 1962, together with a GaP:N-based green LEDs. Furthermore, in recent years, studies on a method of solving the above problem by implementing a display using a micro-sized light emitting diode have been carried out.

Meanwhile, when implementing a display apparatus using a semiconductor light emitting device, the most important technology is to transfer a microchip (<100 μm) to a desired substrate at high speed. In the transfer of micro-LEDs, it is advantageous in terms of processability, commerciality and mass-productivity to minimize the number of transfers and additional wiring processes, but the difficulty of transfer is very high.

Accordingly, the present disclosure proposes a display apparatus having a new structure capable of solving problems that may occur in the transfer process.

SUMMARY

An aspect of the present disclosure is to provide a new mechanism in which a simpler process is applicable in a display apparatus using a semiconductor light emitting device.

Another aspect of the present disclosure is to provide a structure capable of solving a step problem that may occur in a transfer process.

As a means of solving the problem, in the present disclosure, a bump having a structure in which a free end can be bent in the form of a cantilever is used.

More specifically, a display apparatus according to the present disclosure may include at least one horizontal semiconductor light emitting device having a first conductive electrode and a second conductive electrode, first and second wirings disposed to be spaced apart from each other on the substrate, and electrically connected to the first and second conductive electrodes, respectively, a first bump disposed between the first wiring and the first conductive electrode, and a second bump disposed between the second wiring and the second conductive electrode, wherein at least one of the first and second bumps protrudes toward the other one from an edge of either one of the first and second wirings.

In an embodiment, at least one of the first and second bumps may protrude from the edge into a space between the first and second wirings.

In an embodiment, the first bump may include a first portion that covers an upper surface of the first wiring, and a second portion that protrudes from the first portion toward the second wiring. The first conductive electrode may overlap a second portion of the first bump.

In an embodiment, the second bump may include a first portion that covers an upper surface of the second wiring, and a second portion that protrudes from the first portion toward the first wiring. The second conductive electrode may overlap a second portion of the second bump.

In an embodiment, a gap may be defined between the substrate and the second portion of the first bump, and between the substrate and the second portion of the second bump, respectively. The second portion of the first bump and the second portion of the second bump may be defined with inclined portions at lower sides thereof to vary a size of the gap. The second portions of the first and second bumps may have a larger thickness than the first portions of the first and second bumps, respectively.

In an embodiment, the first and second bumps may be respectively defined to cover upper and side surfaces of the first or the second wiring. An area that is not covered by the first bump or the second bump may be respectively defined on upper and side surfaces of the first or the second wiring.

In an embodiment, one end of at least one of the first and second bumps may be fixed to the first or the second wiring, and the other end thereof may define a free end to allow at least one of the first and second bumps to be bent.

In an embodiment, the first bump second bumps may have a thickness difference from each other, and the thickness difference may be compensated when the first conductive electrode and the second conductive electrode are coupled to the first and second bumps, respectively, by the bending modification of the free end. The first and second bumps may have elasticity with respect to the bending of the free end.

In an embodiment, the first and second bumps may include at least one of Cu, Sn, In, Al, Ag, Au, Ni, Ti, and Mo, and the substrate may be formed of a flexible material.

According to the present disclosure having the foregoing configuration, it may be possible to provide a process capable of transferring a micro-LED at room temperature since a bump having an elastic structure is used.

Furthermore, the present disclosure may cover a step that may occur between chips or between bumps using the material, pattern and size of a bump, a space under the bump, and the flexibility of a substrate.

In addition, an elastic structured bump in the present disclosure may allow a micro-LED chip formed on a wafer to be bonded to the bump through an atomic diffusion or reflow process. Through this, a wiring process of a light source in a display apparatus may be simplified.

DETAILED DESCRIPTION OF THE EMBODIMENTS

Figure 1:
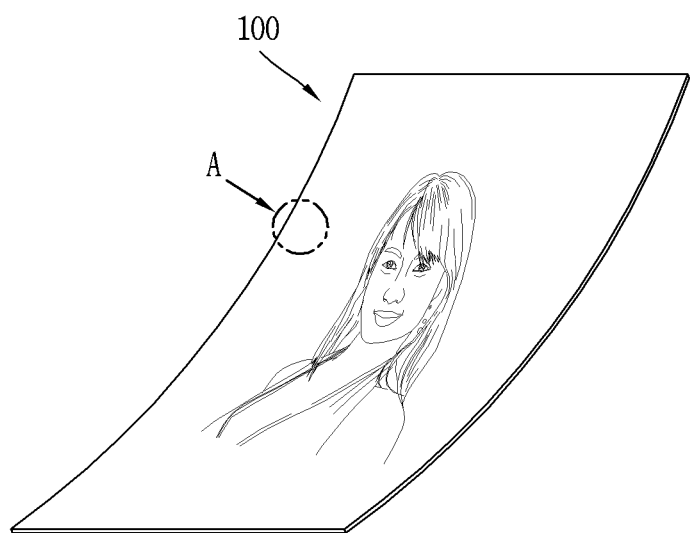
FIG. 1 is a conceptual view showing a display apparatus using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the other element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display apparatus using a semiconductor light-emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting device. According to the present disclosure, a light-emitting diode (LED) is illustrated as a type of semiconductor light-emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
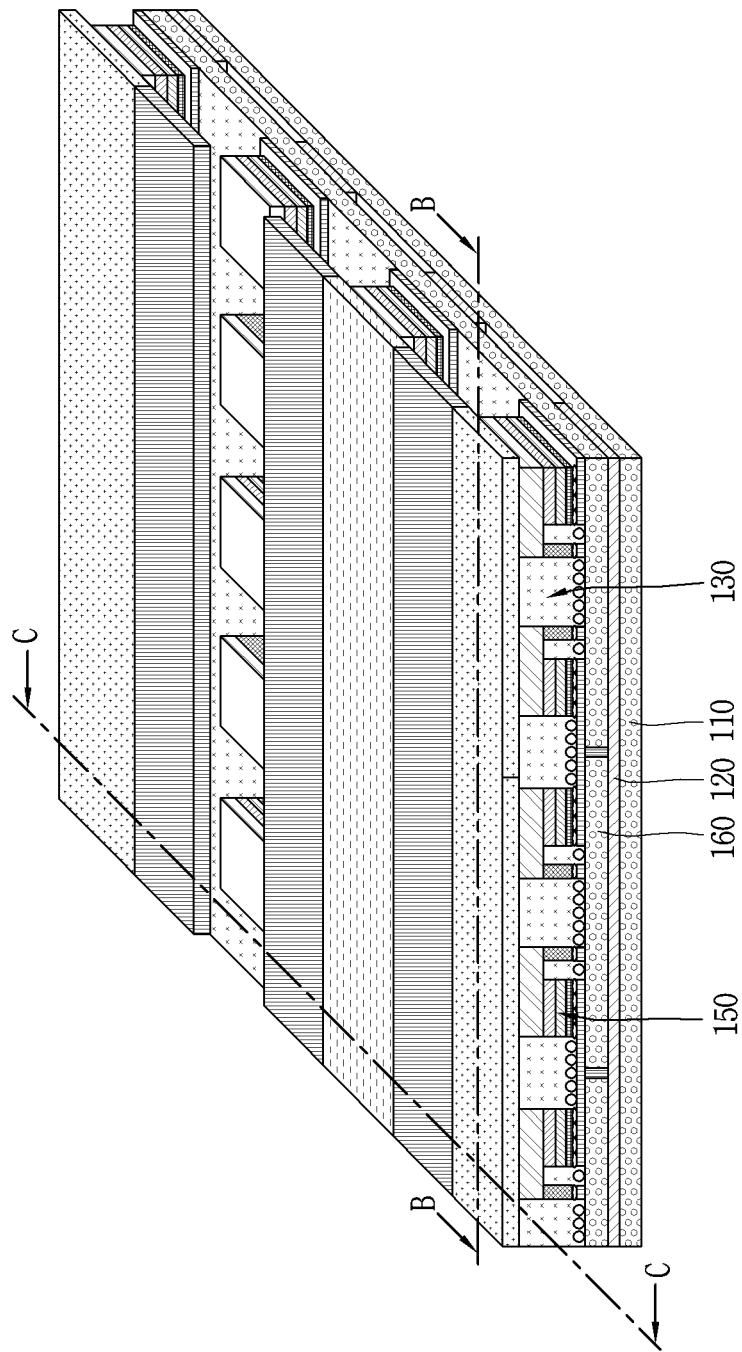
FIG. 2 is a partial enlarged view of portion "A" in FIG. 1, and FIGS. 3A and 3B are cross-sectional views taken along lines B-B and C-C in FIG. 2.
Figure 3A:
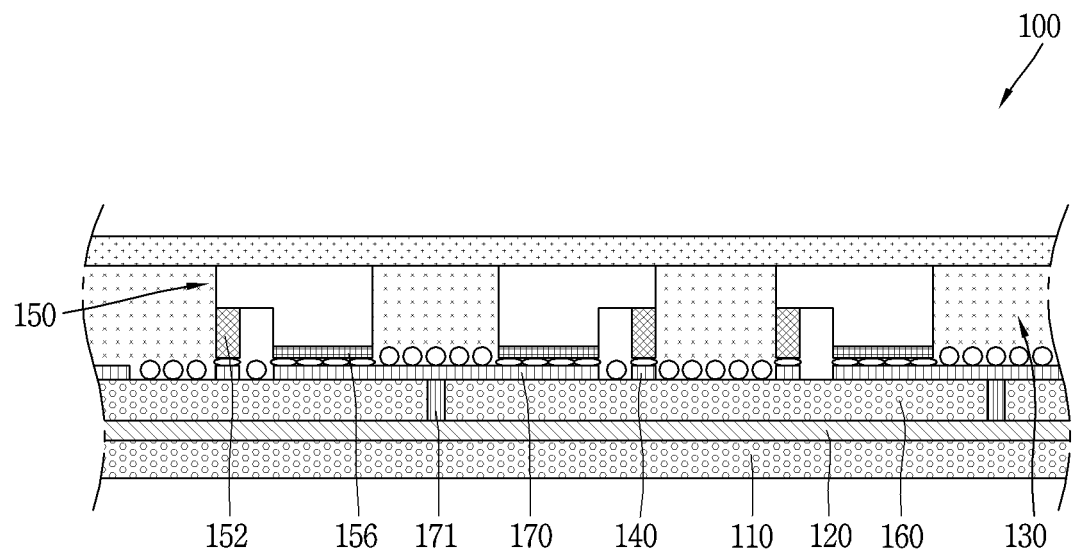
Figure 3B:
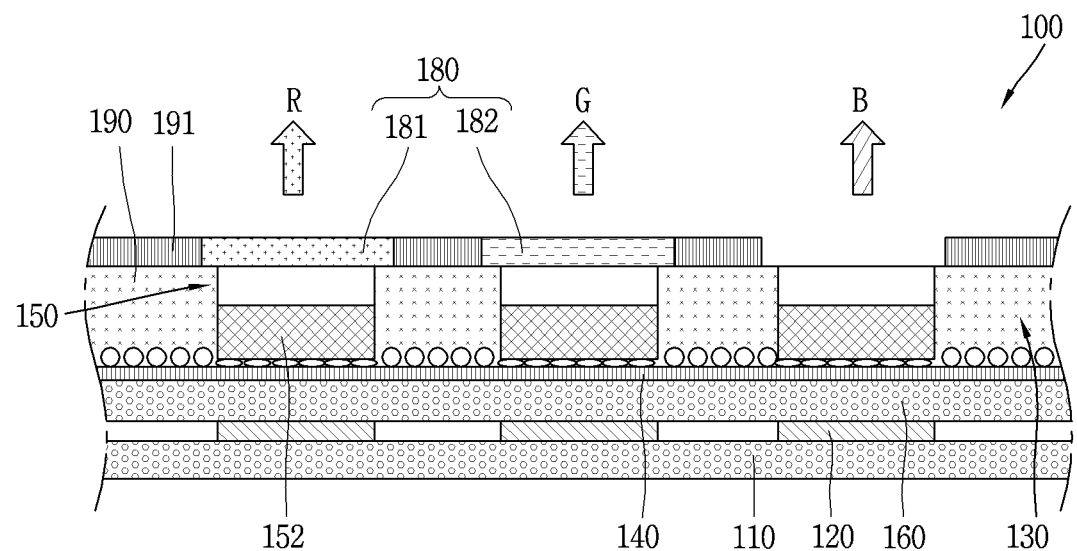
Figure 4:
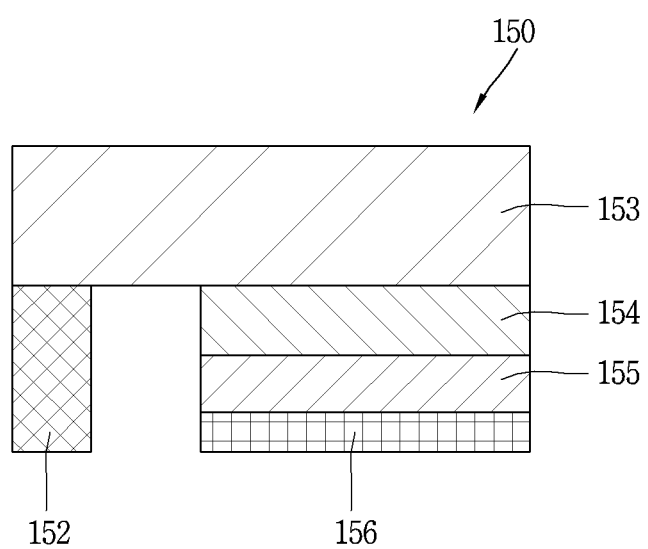
FIG. 4 is a conceptual view showing a flip-chip type semiconductor light-emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A to 5C are conceptual views illustrating various forms for implementing colors in connection with a flip-chip type semiconductor light emitting device.

According to the drawings in FIGS. 2, 3A and 3B, there is illustrated a display apparatus 100 using a passive matrix (PM) type semiconductor light-emitting device as a display apparatus 100 using a semiconductor light-emitting device. However, an example described below may also be applicable to an active-matrix (AM) type semiconductor light-emitting device.

The display apparatus 100 may include a substrate 110, a first electrode 120, a conductive adhesive layer 130, a second electrode 140, and a plurality of semiconductor light-emitting devices 150.

The substrate 110 may be a flexible substrate. The substrate 110 may contain glass or polyimide (PI) to implement the flexible display apparatus. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a state in which the insulating layer 160 is deposited on the substrate 110 may be a single wiring substrate. More specifically, the insulating layer 160 made of an insulating and flexible material such as polyimide (PI), PET, PEN or the like may be integrally formed with the substrate 110 to form a single wiring substrate.

The auxiliary electrode 170 as an electrode for electrically connecting the first electrode 120 to the semiconductor light-emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting device 150 is connect thereto in a flip chip form with the application of heat and pressure, the semiconductor light-emitting device 150 is electrically connected to the first electrode 120 and second electrode 140.

Referring to FIG. 4, the semiconductor light-emitting device may be a flip chip type semiconductor light-emitting device.

For example, the semiconductor light-emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array.

The light emitting device array may include a plurality of semiconductor light emitting devices with different self-luminance values. Each of the semiconductor light-emitting devices 150 constitutes a sub-pixel, and is electrically connected to the first electrode 120. For example, there may exist a plurality of first electrodes 120, and the semiconductor light-emitting devices are arranged in several rows, for instance, and each row of the semiconductor light-emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light-emitting device 150 may have excellent luminance characteristics, and thus it may be possible to configure individual unit pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light emitting device 150. For example, the semiconductor light-emitting device 150 is a blue semiconductor light-emitting device that emits blue (B) light, and the phosphor layer 180 performs a function of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting device 151 at a position implementing a red sub-pixel, and a green phosphor 182 capable of converting blue light into green (G) light may be deposited on the blue semiconductor light-emitting device 151 at a position implementing a green sub-pixel. Furthermore, only the blue semiconductor light-emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting device 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
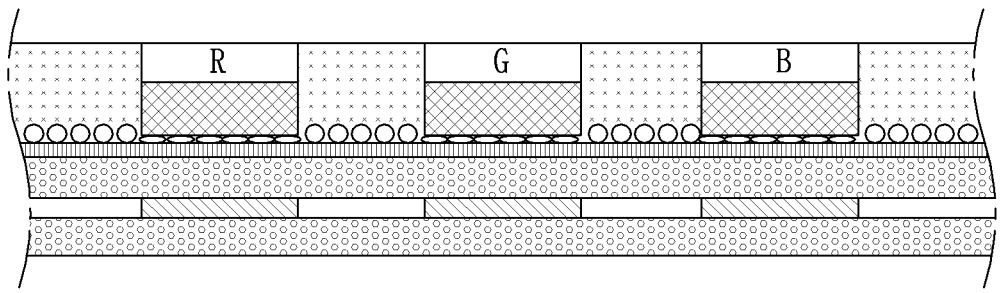
FIGS. 5A to 5C are conceptual views showing various forms for implementing colors in connection with a flip-chip type semiconductor light-emitting device.

Referring to FIG. 5A, each of the semiconductor light-emitting devices 150 may be implemented with a high-power light-emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
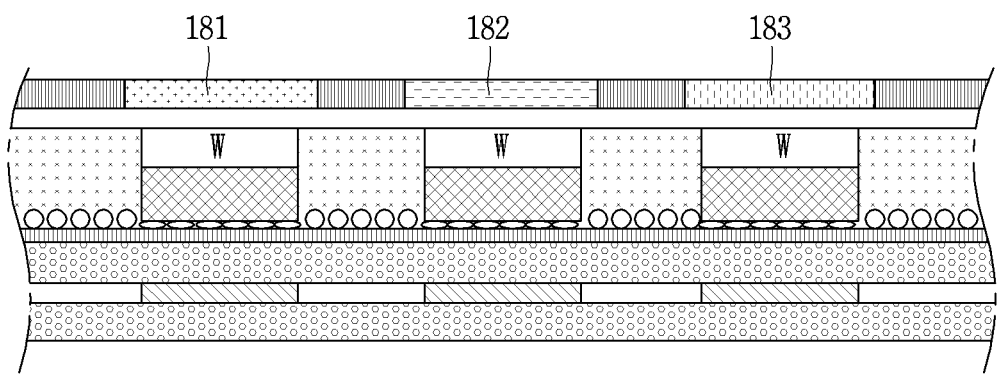

Referring to FIG. 5B, the semiconductor light-emitting device may have a white light-emitting device (W) provided with a yellow phosphor layer for each element. In this case, a red phosphor layer 181, a green phosphor layer 182 and blue phosphor layer 183 may be provided on the white light-emitting device (W) to implement a sub-pixel. Furthermore, a color filter repeated with red, green and blue on the white light-emitting device (W) may be used to implement a sub-pixel.

Figure 5C:
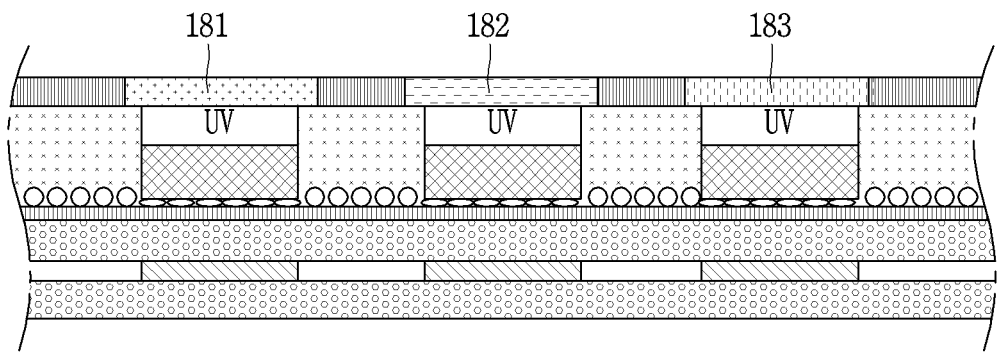

Referring to FIG. 5C, it may be possible to also have a structure in which a red phosphor layer 181, a green phosphor layer 182 and blue phosphor layer 183 may be provided on a ultra violet light-emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light-emitting device 150 is placed on the conductive adhesive layer 130 to constitute a sub-pixel in the display apparatus. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting device 150 with a length of side of 10 μm is used for a sub-pixel, it will exhibit a sufficient brightness for implementing a display apparatus. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display apparatus having a HD image quality.

A display apparatus using the foregoing semiconductor light-emitting device will be manufactured by a new type of manufacturing method. Hereinafter, the manufacturing method will be described with reference to FIG. 6.

Figure 6:
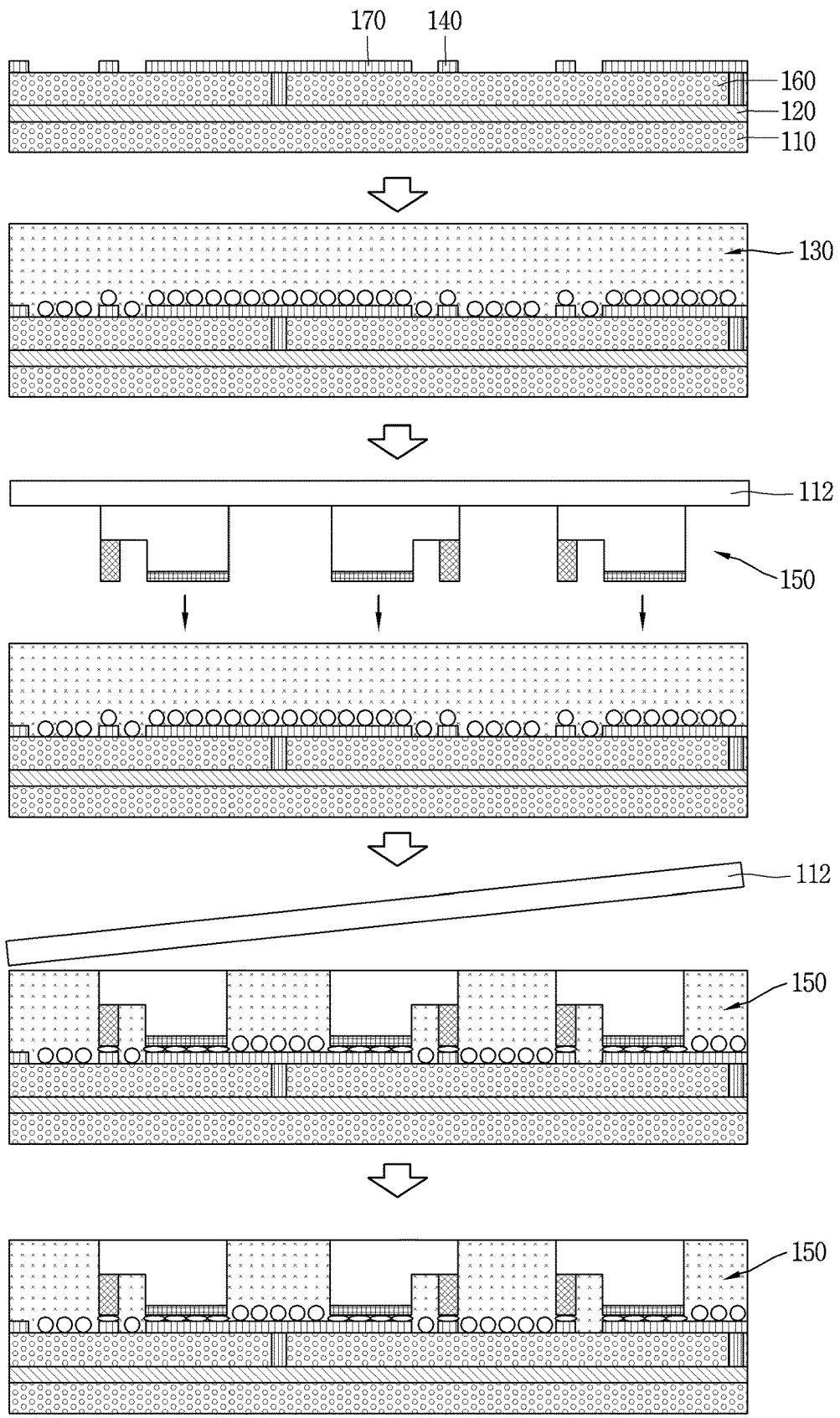
FIG. 6 is cross-sectional views showing a manufacturing method of a display apparatus using a semiconductor light-emitting device according to the present disclosure.

FIG. 6 is cross-sectional views illustrating a manufacturing method of a display apparatus using a semiconductor light-emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light-emitting device 150 may be inserted into the anisotropic conductive film, thereby forming a partition wall between the semiconductor light-emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light-emitting device 150 to form a transparent insulating layer (not shown).

Furthermore, it may further include the process of forming a phosphor layer on one surface of the semiconductor light-emitting device 150. For example, the semiconductor light-emitting device 150 may be a blue semiconductor light-emitting device for emitting blue (B) light, and red or green phosphor for converting the blue (B) light into the color of the sub-pixel may form a layer on one surface of the blue semiconductor light-emitting device.

The manufacturing method or structure of a display apparatus using the foregoing semiconductor light-emitting device may be modified in various forms. For such an example, the foregoing display apparatus may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
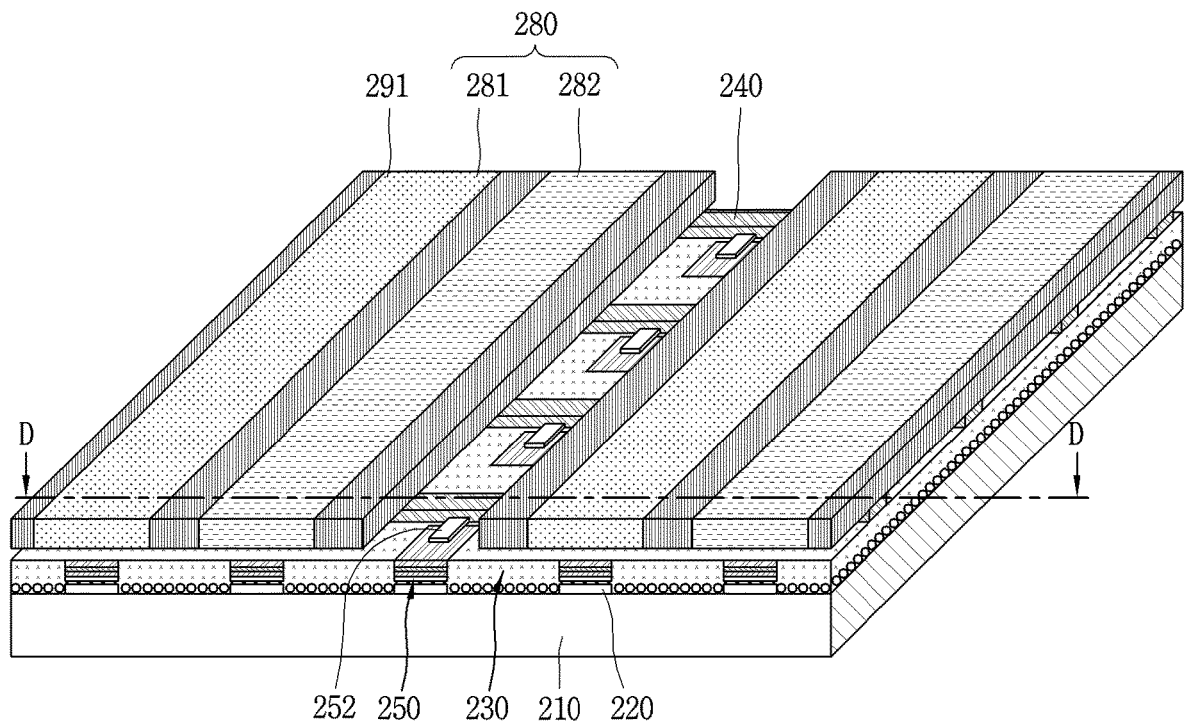
FIG. 7 is a perspective view showing a display apparatus using a semiconductor light-emitting device according to another embodiment of the present disclosure.
Figure 8:
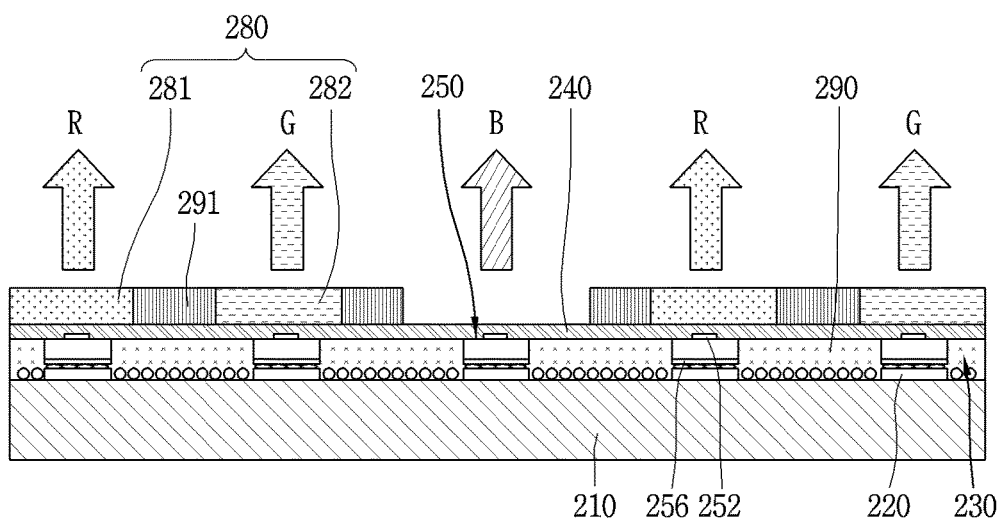
FIG. 8 is a cross-sectional view taken along line D-D in FIG. 7.
Figure 9:
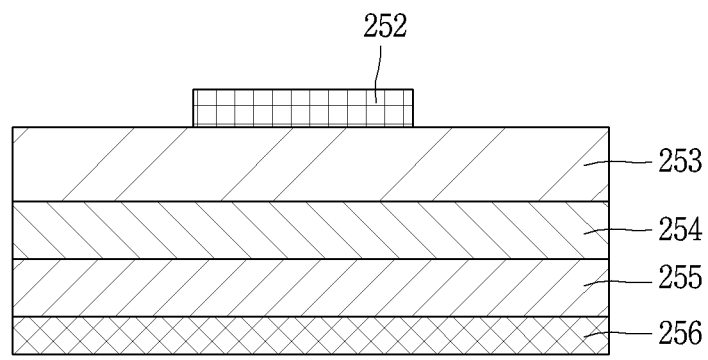
FIG. 9 is a conceptual view showing a vertical semiconductor light emitting device in FIG. 8.

FIG. 7 is a perspective view illustrating a display apparatus using a semiconductor light emitting device according to another embodiment of the present disclosure. FIG. 8 is a cross-sectional view taken along line D-D in FIG. 7, and FIG. 9 is a conceptual view illustrating a vertical type semiconductor light emitting device in FIG. 8.

According to the drawings, the display apparatus may be display apparatus using a passive matrix (PM) type of vertical semiconductor light-emitting device.

The display apparatus may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display apparatus to which a flip chip type light-emitting device is applied, the conductive adhesive layer 230 may be an anisotropic conductive film (ACF), an anisotropic conductive paste, a solution containing conductive particles, and the like. However, the present embodiment also illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting device 250 thereto, the semiconductor light-emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting device 250 and the first electrode 220.

In this manner, the semiconductor light emitting device 250 is placed on the conductive adhesive layer 230, thereby configuring a separate sub-pixel in the display apparatus. The semiconductor light-emitting device 250 may have excellent luminance characteristics, and thus it may be possible to configure individual unit pixels even with a small size thereof. The size of the individual semiconductor light-emitting device 250 may be less than 80 μm in the length of one side thereof, and formed with a rectangular or square shaped element. In case of a rectangular shaped element, the size thereof may be less than 20×80 μm.

The semiconductor light-emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light-emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting device 250, thereby providing a great advantage capable of reducing the chip size.

Referring again to FIG. 8, a phosphor layer 280 may be formed on one surface of the semiconductor light-emitting device 250. For example, the semiconductor light-emitting device 250 is a blue semiconductor light-emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting device 251 at a position implementing a red sub-pixel, and a green phosphor 282 capable of converting blue light into green (G) light may be deposited on the blue semiconductor light-emitting device 251 at a position implementing a green sub-pixel. Furthermore, only the blue semiconductor light-emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light-emitting device is applied.

Taking the present embodiment into consideration again, the second electrode 240 is located between the semiconductor light-emitting devices 250, and electrically connected to the semiconductor light-emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display apparatus.

If the second electrode 240 is precisely located on the conductive adhesive layer 230 between the semiconductor light emitting devices 250, the partition wall 290 may be located between the semiconductor light emitting device 250 and second electrode 240. Accordingly, individual unit pixels may be configured even with a small size using the semiconductor light-emitting device 250, and a distance between the semiconductor light-emitting devices 250 may be relatively sufficiently large to place the second electrode 240 between the semiconductor light-emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 can enhance the contrast of luminance.

On the other hand, in recent years, the semiconductor light emitting device 250 may be metal-bonded to a wiring instead of the conductive adhesive layer 230. However, in this case, there is a problem in that it is difficult to secure a transfer yield due to a height difference between wirings or the like. In the present disclosure, in order to solve this problem, a cantilever-shaped bump structure is proposed. The cantilever-shaped bump has elasticity, and uses such elasticity to prevent transfer defects due to height differences between wirings, which will be described in detail below.

Hereinafter, with reference to the accompanying drawings, a display apparatus to which a new structure is applied will be described in more detail.

Figure 10:
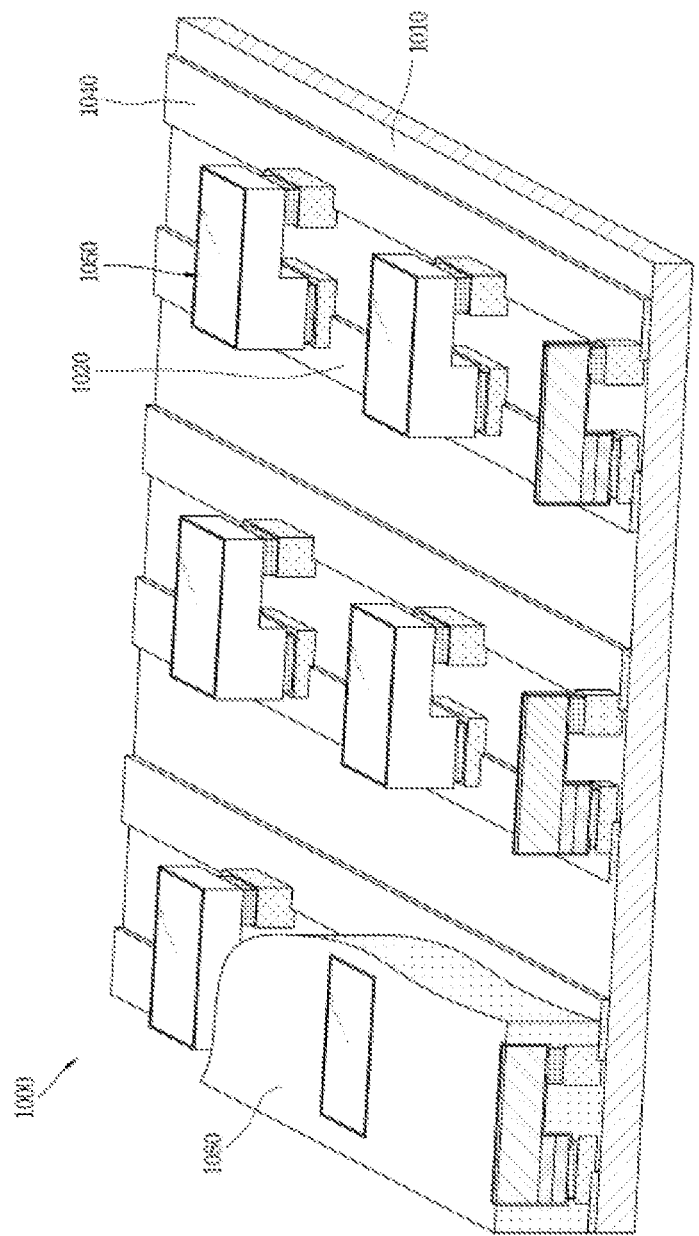
FIGS. 10 and 11 are an enlarged view and a plan view of a portion A of FIG. 1 for explaining another embodiment of the present disclosure to which a semiconductor light emitting device having a new structure according to the present disclosure is applied.
Figure 11:
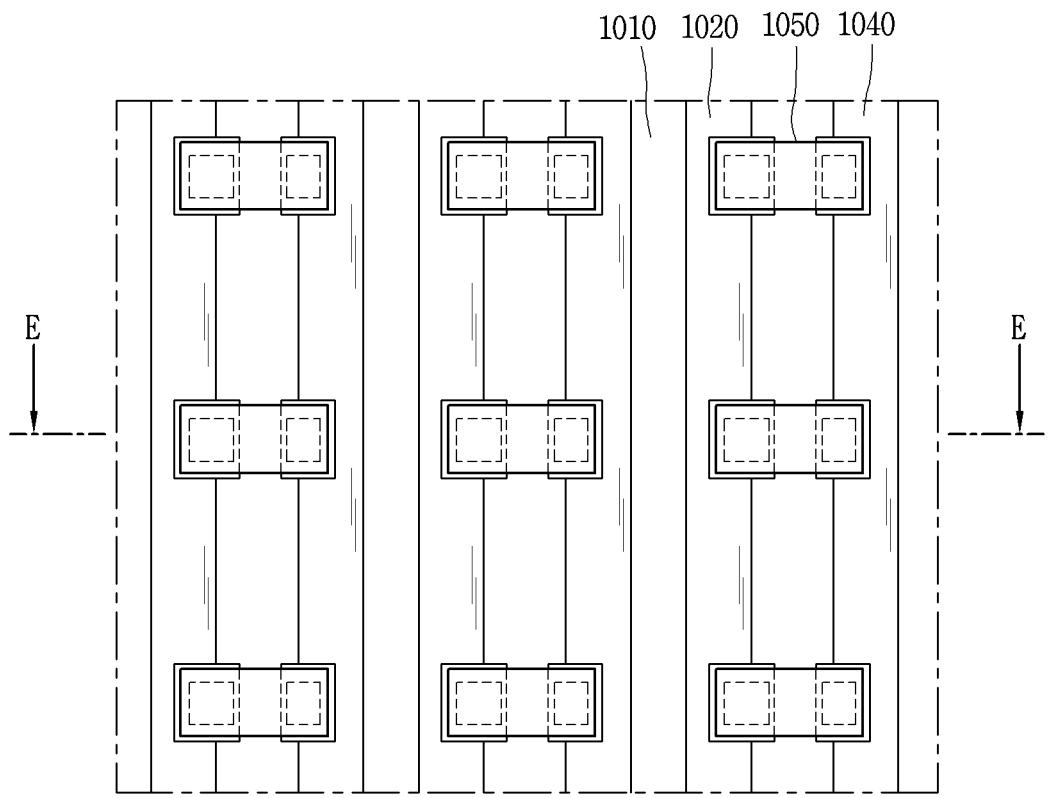
Figure 12:
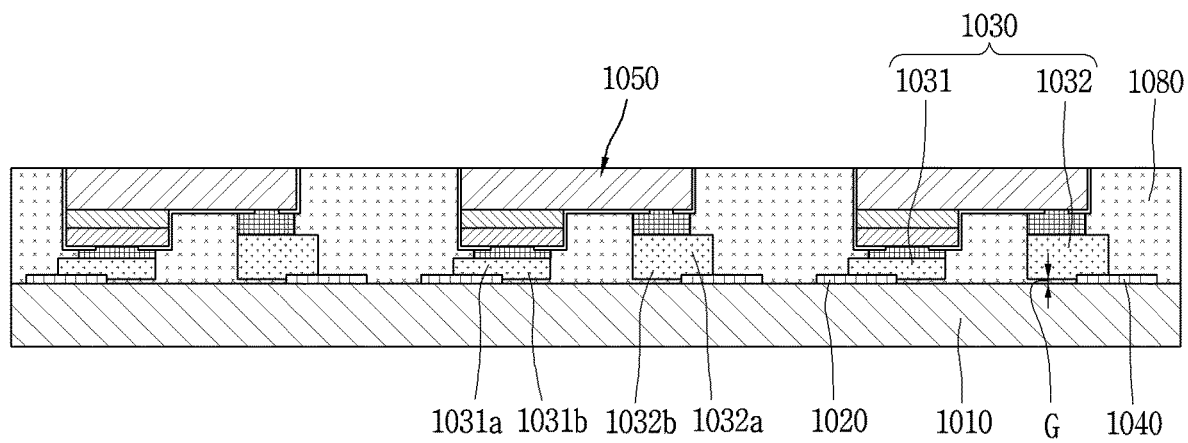
FIG. 12 is a cross-sectional view taken along line E-E in FIG. 11.
Figure 13:
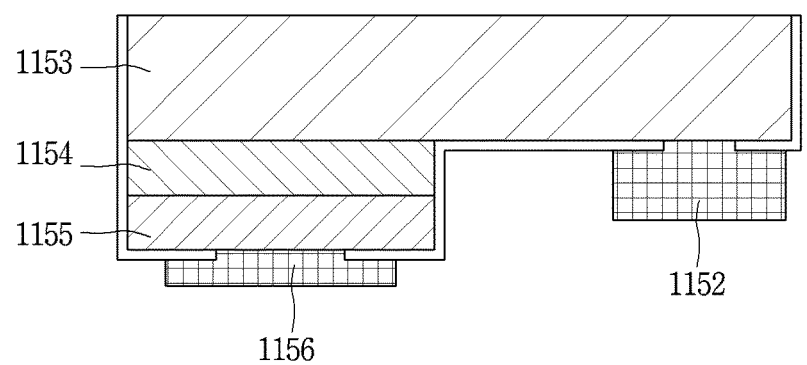
FIG. 13 is an enlarged view showing a horizontal semiconductor light-emitting device in FIG. 10.

FIGS. 10 and 11 are an enlarged view and a plan view of a portion A of FIG. 1 for explaining another embodiment of the present disclosure to which a semiconductor light emitting device having a new structure according to the present disclosure is applied, FIG. 12 is a cross-sectional view taken along line E-E in FIG. 11, and FIG. 13 is an enlarged view showing a horizontal semiconductor light-emitting device in FIG. 10.

According to the drawings in FIGS. 10, 11, 12 and 13, there is illustrated a display apparatus 1000 using a passive matrix (PM) type semiconductor light emitting device as a display apparatus 1000 using a semiconductor light emitting device. However, an example described below may also be applicable to an active-matrix (AM) type semiconductor light-emitting device.

The display apparatus 1000 may include a substrate 1010, a first wiring 1020, a bump 1030, a second wiring 1040, and a horizontal semiconductor light emitting device 1050. Here, the first wiring 1020 and the second wiring 1040 may respectively include a plurality of electrode lines.

The substrate 1010, which is a wiring substrate on which the first wiring 1020 and the second wiring 1040 are disposed, may be formed of a flexible material. For such an example, the substrate may be a flexible base film. Furthermore, the substrate may include polyimide (PI) to implement a flexible display apparatus. In addition, the present disclosure may be implemented as a non-flexible display or signage, and the base substrate 1010 may be a base layer on which a structure is formed through an entire process, and may be a wiring substrate on which a reflective layer (not shown) is disposed.

Furthermore, the substrate 1010 may be a thin metal. In addition, if it is an insulating and flexible material, any one such as polyethylene naphthalate (PEN), polyethylene terephthalate (PET) or the like may be used. Furthermore, the substrate 110 may be either one of transparent and non-transparent materials. Meanwhile, a heat dissipation sheet, a heat sink, or the like may be mounted on the substrate 1010 to implement a heat dissipation function.

The first wiring 1020 may be located on the substrate 1010, and defined with a bar-shaped electrode elongated in one direction. The first wiring 1020 may be formed to perform the role of a data electrode.

The first wiring 1020 and the second wiring 1040 may be disposed between the semiconductor light emitting devices. Referring to the present drawings, the first wiring 1020 and the second wiring 1040 may be disposed to be respectively connected to the first conductive electrode 1156 and the second conductive electrode 1152 of the horizontal semiconductor light emitting device on the substrate. The first wiring 1020 and the second wiring 1040 may be formed of the same material since they are disposed on the same surface of the substrate 1010.

In this case, an insulating layer 1080 filling a space between the semiconductor light emitting devices may be disposed on the substrate. According to circumstances, a transparent insulating layer containing silicon oxide (SiOx) may be formed on the substrate 1010 formed with the semiconductor light-emitting device 1050.

According to the illustration, the semiconductor light emitting device 1050 may have excellent luminance characteristics, and thus it may be possible to configure individual sub-pixels even with a small size thereof. The size of the individual semiconductor light-emitting device 1050 may be less than 80 μm in the length of one side thereof, and formed with a rectangular or square shaped element. In this case, the area of a single semiconductor light emitting device may have a range of $10^{-10} \sim 10^{-5}$ m$^2$, and a distance between the light emitting devices may have a range of 100 μm to 10 mm.

On the other hand, the semiconductor light emitting device 1050 may be a flip-chip type light-emitting device. However, the present disclosure is not limited thereto, and the semiconductor light emitting device may be a vertical light emitting device.

The semiconductor light emitting devices 1050 may be green or blue semiconductor light emitting devices. The green semiconductor light emitting device and the blue semiconductor light emitting device may be mostly formed of gallium nitride (GaN), and indium (In) and/or aluminum (Al) may be added thereto to implement a high-power light emitting device that emits green or blue light. For such an example, the plurality of semiconductor light emitting devices 1050 may be gallium nitride thin layers formed with various layers, such as n-Gan, p-Gan, AlGaN, InGan, and the like.

In addition, the semiconductor light emitting device may be a micro light emitting diode chip. Here, the micro light emitting diode chip may have a cross-sectional area smaller than that of the light emitting region in the sub-pixel, and may have a scale of 1 to 100 micrometers, for such an example.

Referring to FIG. 13, the horizontal semiconductor light emitting device includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 disposed to be spaced apart from the first conductive electrode 1156 in a horizontal direction on the second conductive semiconductor layer 1153. In this case, the second conductive electrode is disposed on one surface of the second conductive semiconductor layer 1153, and an undoped semiconductor layer is formed on the other surface of the second conductive semiconductor layer 1153. In addition, a passivation layer 1157 may cover the first conductive semiconductor layer 1155, the active layer 1154, and the second conductive semiconductor layer 1153.

Furthermore, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type. However, the p-type semiconductor layer may be p-type GaAs and the n-type semiconductor layer may be n-type GaAs.

In addition, according to another embodiment of the present disclosure, impurities may be implanted into an intrinsic or a doped semiconductor substrate to form the first and the second conductive semiconductor layer. Moreover, the region where a p-n junction is formed by the impurity implantation may serve as the active layer. Here, the p-type electrode and the n-type electrode may each include a plurality of metal layers made of different metals. For example, a plurality of metal layers made of Ti, Pt, Au, Ti, Cr or the like may be deposited to form the p-type and n-type electrodes.

In this case, the p-type electrode may be electrically connected by the first wiring 1020 and the bump 1030, and the n-type electrode may be electrically connected by the second wiring 1040 and the bump 1030. The first wiring 1020 and the second wiring 1040 may be formed as line-shaped electrodes.

For example, the first wiring 1020 and the second wiring 1040 are disposed to be spaced apart from each other on a substrate, and electrically connected to the first conductive electrode 1156 and the second conductive electrode 1152, respectively. More specifically, the second wiring 1040 is disposed in parallel to the first wiring 1020, and the first wiring 1020 and the second wiring 1040 are electrically connected by the semiconductor light emitting device 1050 and the bump. To this end, the first conductive electrode 1156 and the second conductive electrode 1152 of the semiconductor light emitting device may be disposed at positions overlapping the first wiring 1020 and the second wiring 1040, respectively. The first conductive electrode 1156 and the second conductive electrode 1152 may be electrically connected to the first wiring 1020 and the second wiring 1040 through the bump, respectively.

The bump 1030 may include a first bump 1031 connected to the first conductive electrode 1156 and a second bump 1032 connected to the second conductive electrode 1152. In other words, the first bump 1031 is disposed between the first wiring and the first conductive electrode, and the second bump 1032 is disposed between the second wiring and the second conductive electrode. The first bump 1031 and the second bump 1032 may include at least one of Cu, Sn, In, Al, Ag, Au, Ni, Ti, and Mo.

Here, the first wiring 1020 and the second wiring 1040 may be formed to have the same height protruding from the substrate 1010. However, it is very difficult to manufacture the bumps that physically couple the wiring and the conductive electrode to have the same height, and thus, there is a step difference between adjacent chips or between bumps. Furthermore, in the horizontal semiconductor light emitting device, the n-type electrode and the p-type electrode have a height difference with respect to an n-type semiconductor layer.

In the present example, at least one of the first bump 1031 and the second bump 1032 protrudes from either one edge of the first wiring 1020 and the second wiring 1040 toward the other one to solve the problem of height difference. For example, at least one of the first bump 1031 and the second bump 1032 may protrude from the edge into a space between the first wiring 1020 and the second wiring 1040.

For at least one of the first bump 1031 and the second bump 1032, one end thereof is fixed to the first wiring 1020 or the second wiring 1040, and the other end thereof forms a free end to allow at least one of the first bump 1031 and the second bump 1032 to be bent. As the conductive electrode of the semiconductor light emitting device is coupled to an upper surface of the free end, the free end is bent, and a height difference between the first bump 1031 and the second bump 1032 may be compensated by the bending.

More specifically, the first bump 1031 may include a first portion 1031*a* that covers an upper surface of the first wiring 1020 and a second portion 1031*b* protruding toward the second wiring 1040 from the first portion 1031*a*. A portion located at an inner side with respect to the edge of the first wiring 1020 may be the first portion 1031*a*, and a portion formed at an outer side thereof may be the second portion 1031*b*.

The first portion 1031*a* is coupled to the upper surface of the first wiring 1020 to form a fixed end, and the second portion 1031*b* protrudes from the first wiring toward the second wiring 1040 to form the foregoing free end. In this case, the first conductive electrode 1156 overlaps the second portion 1031*b* of the first bump 1031 to apply a force to the second portion 1031*b*. By the force, a bending moment acts on the first bump 1031 to bend the first bump 1031.

On the other hand, similar to the first bump 1031, the second bump 1032 may include a first portion 1032*a* that covers an upper surface of the second wiring 1040 and a second portion 1032*b* protruding toward the first wiring 1020 from the first portion 1032*a*. Since the height can be compensated even when a bending moment acts on only one of the first bump 1031 and the second bump 1032, only the first bump 1031 may have a free end. However, the present disclosure is not limited thereto, and as shown in the present example, both sides may be bent by a structure having free ends to further facilitate compensation. Accordingly, the second conductive electrode may overlap the second portion 1032b of the second bump 1032.

As shown, the second portions 1031b, 1032b of the first bump 1031 and the second bump 1032 may protrude toward each other from the first wiring 1020 and the second wiring 1040, respectively. Through this, the first bump 1031 and the second bump 1032 have elasticity with respect to the bending of the free end. To this end, a gap (G) may be formed between the bump and the substrate. For example, the gap (G) may be formed between the substrate and the second portion 1031b of the first bump 1031 and between the substrate and the second portion 1032b of the second bump 1032, respectively. The gap (G), which is a space formed between an upper surface of the substrate 1010 and a lower surface of the second portion 1031b, 1032b, provides a space in which the free end is bent. In embodiments, the number of the gap (G) can vary, and more than one gap (G) can be present for each of the first bump 1031 and second bump 1032. Also, in other embodiments, one or more part of the second portion can have an extension that can contact or come close to contacting the substrate 1010.

In addition, the second portions 1031b, 1032b of the first bump 1031 and the second bump 1032 may have a larger thickness than the first portions 1031a, 1032a of the first bump 1031 and the second bump 1032, respectively. In other words, the first bump 1031 and the second bump 1032 may be formed to not only cover the upper surfaces of the first wiring 1020 and the second wiring 1040, but also cover the side surfaces of the first wiring 1020 and the second wiring 1040, respectively. In this case, the bump may have a structure that does not cover both entire upper and side surfaces, but covers part thereof. For example, a region that is not covered by the first bump 1031 or the second bump 1032 may be respectively defined on upper and side surfaces of the first wiring 1020 or the second wiring 1040. With this structure, the bump has a shape similar to that of a cantilever, and an elastic bump may be implemented by the bending of the cantilever.

In the present example, the first bump 1031 and the second bump 1032 may have a thickness difference from each other. The second bump 1032 facing the second conductive electrode 1152 may have a larger thickness than the first bump 1031 facing the first conductive electrode 1156. This is to compensate for a lower height than the first conductive electrode 1156 with respect to the upper surface of the semiconductor light emitting device since the second conductive electrode 1152 is formed on the second conductive semiconductor layer 1153. However, even with the compensation structure, a gap between the bump and the conductive electrode may be different in the first bump 1031 and the second bump 1032, and the gap difference may be compensated by the bending of the bump. In other words, the thickness difference may be compensated when the first conductive electrode and the second conductive electrode are coupled to the first bump 1031 and the second bump 1032, respectively, by the bending modification of the free end.

Figure 14:
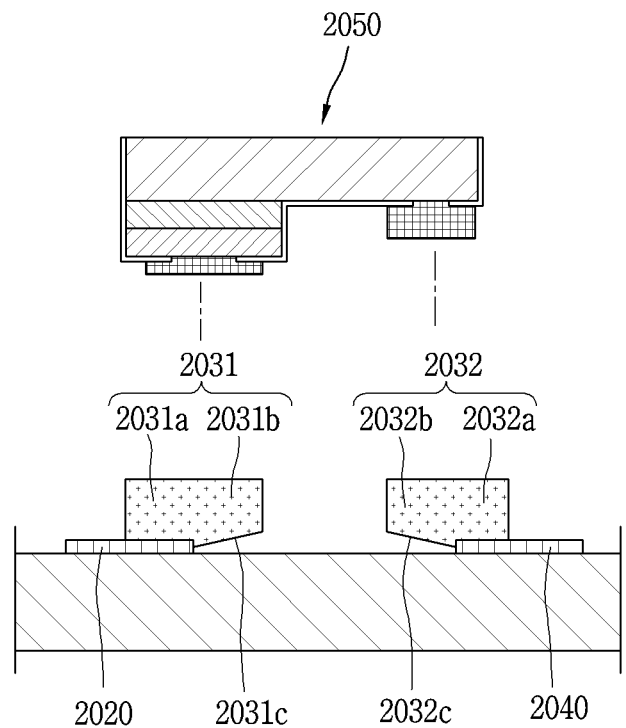
FIG. 14 is a cross-sectional view showing another embodiment of a bump according to the present disclosure.

On the other hand, the bump of the present disclosure may be modified into other shapes. FIG. 14 is a cross-sectional view showing another embodiment of a bump according to the present disclosure, and FIGS. 15A to 15D are plan views showing still other embodiments of a bump according to the present disclosure.

Referring to FIG. 14, a second portion 2031b of the first bump 2031 and a second portion 2032b of the second bump 2032 may be defined with inclined portions 2031c, 2032c at lower sides thereof to vary a size of the gap (G).

For example, a lower surface of the second portion 2031b of the first bump 2031 may have a first inclined portion 2031c that is inclined upward to increase the gap (G) toward the second wiring 2040. In addition, a lower surface of the second portion 2032b of the second bump 2032 may include a second inclined portion 2032c that is inclined upward to increase the gap toward the first wiring 2020. According to this structure, since the gap has the largest size at the ends of the second portions 2031b and 2032b, a space in which the second portions 2031b and 2032b is bent may be further secured.

Figure 15A:
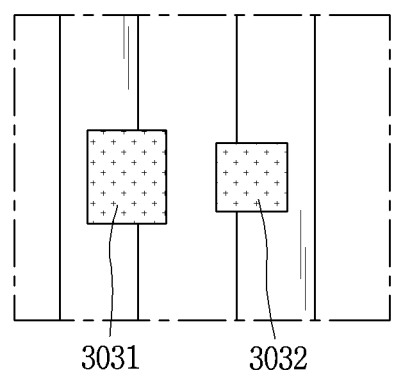
FIGS. 15A to 15D are plan views showing still other embodiments of a bump according to the present disclosure.
Figure 15B:
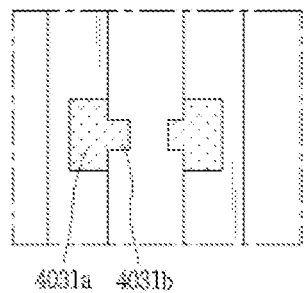
Figure 15C:
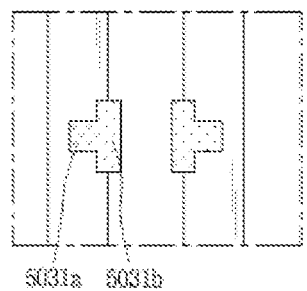

For another example, as shown in FIG. 15A, the first bump 3031 and the second bump 3032 may have different areas. For still another example, the second portion 4031b may protrude from part of the first portion 4031a as shown in FIG. 15B, or the first portion 5031a may protrude from part of the second portion 5031b as shown in FIG. 15C.

Figure 15D:
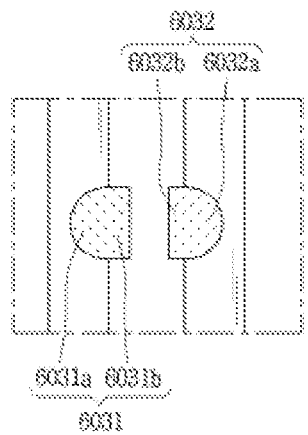

For yet still another example, as shown in FIG. 15D, the shapes of the first portion 6031 and the second portion 6032 may be formed to be different from each other. More specifically, the first portion 6031 may be formed in a semicircular shape, and the second portion 6032 may be formed in a rectangular shape. In this way, the shape of the bump may be modified in various ways.

For yet still another example, as shown in FIG. 15D, for the first bump 6031 and the second bump 6032, the shapes of the first portion 6031a and the second portion 6032b may be formed to be different from each other. More specifically, the first portion 6031a may be formed in a semicircular shape, and the second portion 6032b may be formed in a rectangular shape. In this way, the shape of the bump may be modified in various ways.

What is claimed is:

1. A display apparatus, comprising:
   at least one horizontal semiconductor light emitting device having a first conductive electrode and a second conductive electrode;
   a first wiring and a second wiring spaced apart from each other on a substrate, and electrically connected to the first and second conductive electrodes, respectively;
   a first bump disposed between the first wiring and the first conductive electrode; and
   a second bump disposed between the second wiring and the second conductive electrode,
   wherein, in a state in which the first conductive electrode and the second conductive electrode are not electrically connected to the first and second wirings through the first bump and the second bump, respectively, at least one of the first and second bumps further comprises:
   a first portion overlapping a portion of an upper surface of one of the first and second wirings to form a fixed end; and
   a second portion protruding from the first portion toward another wiring and forming a free end that does not overlap with either of the first and second wirings, and
   wherein:
   a gap providing a bendable space for the free end is formed between a lower surface of the free end and an upper surface of the substrate,
   the second portion of the first bump has a first inclined portion that is inclined upward to increase the gap toward the second wiring, and the second portion of the second bump has a second inclined portion that is inclined upward to increase the gap toward the first wiring.

2. The display apparatus of claim 1, wherein the at least one of the first and second bumps protrudes from an edge of one of the first and second wirings into a space between the first and second wirings.

3. The display apparatus of claim 1, wherein the first conductive electrode overlaps the second portion of the first bump.

4. The display apparatus of claim 1, wherein the second conductive electrode overlaps the second portion of the second bump.

5. The display apparatus of claim 1, wherein the second portion of the first bump has a larger thickness than the first portion of the first bump.

6. The display apparatus of claim 1, wherein the first and second bumps are respectively defined to cover the upper surface and side surfaces of the first or the second wiring.

7. The display apparatus of claim 6, wherein an area that is not covered by the first bump or the second bump is respectively defined on the upper and side surfaces of the first or the second wiring.

8. The display apparatus of claim 1, wherein the first and second bumps have a thickness difference from each other, and
wherein the thickness difference is compensated when the first conductive electrode and the second conductive electrode are coupled to the first and second bumps, respectively, by at least one of the first and second bumps being bent by the free end.

9. The display apparatus of claim 8, wherein the first and second bumps have elasticity at the free end.

10. The display apparatus of claim 1, wherein the first and second bumps comprise at least one of Cu, Sn, In, Al, Ag, Au, Ni, Ti, and Mo, and
wherein the substrate is formed of a flexible material.

11. The display apparatus of claim 1, wherein the second portion of the second bump has a larger thickness than the first portion of the second bump.

12. The display apparatus of claim 1, wherein an area of the first portion is different from an area of the second portion of the at least one of the first and second bumps in a plan view.

13. A display apparatus, comprising:
at least one horizontal semiconductor light emitting device having a first conductive electrode and a second conductive electrode;
a first wiring and a second wiring spaced apart from each other on a substrate, and electrically connected to the first and second conductive electrodes, respectively;
a first bump disposed between the first wiring and the first conductive electrode; and
a second bump disposed between the second wiring and the second conductive electrode,
wherein the first and second bumps partially overlap with the first and second wirings respectively,
wherein the first bump has a first portion that overlaps the first wiring forming a fixed end and a second portion forming a free end that does not overlap the first wiring, and the second bump has a first portion that overlaps the second wiring forming a fixed end and a second portion forming a free end that does not overlap the second wiring,
wherein a first length of the first portion of the first bump and a second length of the second portion of the first bump are different in a length direction of the first wiring, or a first length of the first portion of the second bump and a second length of the second portion of the second bump are different in a length direction of the second wiring, and
wherein:
a gap providing a bendable space for each free end is formed between a lower surface of the each free end and an upper surface of the substrate,
the second portion of the first bump have a first inclined portion that is inclined upward to increase the gap toward the second wiring, and
the second portion of the second bump have a second inclined portion that is inclined upward to increase the gap toward the first wiring.

14. The display apparatus of claim 13, wherein an area of the first portion is different from an area of the second portion of the at least one of the first and second bumps in a plan view.

* * * * *